(12) United States Patent
Sun (10) Patent No.: US 11,632,891 B2
(45) Date of Patent: Apr. 18, 2023

(54) DISPLAY PANELS, DISPLAY SCREENS, AND DISPLAY DEVICES

(71) Applicant: YUNGU (GU'AN) TECHNOLOGY CO., LTD., Hebei (CN)

(72) Inventor: Jianming Sun, Jiangsu (CN)

(73) Assignee: YUNGU (GU'AN) TECHNOLOGY CO., LTD., Hebei (CN)

( * ) Notice: Subject to any disclaimer, the term of this patent is extended or adjusted under 35 U.S.C. 154(b) by 0 days.

(21) Appl. No.: 17/345,767

(22) Filed: Jun. 11, 2021

(65) Prior Publication Data

US 2021/0303816 A1 Sep. 30, 2021

Related U.S. Application Data

(63) Continuation of application No. PCT/CN2019/113689, filed on Oct. 28, 2019.

(30) Foreign Application Priority Data

Apr. 25, 2019 (CN) .......................... 201910339585.2

(51) Int. Cl.
  *G06F 3/044* (2006.01)
  *G06V 40/13* (2022.01)
  (Continued)

(52) U.S. Cl.
  CPC ......... *H10K 59/38* (2023.02); *G06V 40/1306* (2022.01); *G06V 40/1318* (2022.01);
  (Continued)

(58) Field of Classification Search
  CPC .......... G06V 40/1318; G06V 40/1306; G06V 10/145; G06V 10/143; H01L 27/3234;
  (Continued)

(56) References Cited

U.S. PATENT DOCUMENTS 10,763,321 B2  9/2020  Ma et al.
10,803,285 B2  10/2020 Zhao et al.
(Continued)

FOREIGN PATENT DOCUMENTS

CN  106874866 A  6/2017
CN  107045628 A  8/2017
(Continued)

OTHER PUBLICATIONS

International Search Report and Written Opinion (International Application No. PCT/CN2019/ 113689) with English Translation, dated Jan. 31, 2020, 13 pages.

(Continued)

*Primary Examiner* — Abdul-Samad A Adediran
(74) *Attorney, Agent, or Firm* — Adsero IP (57) ABSTRACT

A display panel, a display screen, and a display device are provided. The display panel includes a display substrate; a light-emitting layer located on the display substrate and comprising a plurality of light-emitting units; an encapsulation structure disposed on the light-emitting layer to encapsulate the light-emitting layer; and a visible light conversion layer configured to receive visible lights and convert the visible lights into non-visible lights; wherein the visible light conversion layer is disposed in the encapsulation structure or the display substrate.

19 Claims, 6 Drawing Sheets

(51) Int. Cl.
    *H01L 27/146* (2006.01)
    *H01L 31/0232* (2014.01)
(52) U.S. Cl.
    CPC ......... *H10K 50/844* (2023.02); *H10K 59/122* (2023.02); *H10K 59/124* (2023.02); *H10K 59/65* (2023.02); *H01L 27/14625* (2013.01); *H01L 27/14678* (2013.01); *H01L 31/02322* (2013.01)
(58) Field of Classification Search
    CPC ............. H01L 27/3246; H01L 27/3258; H01L 51/5253; H01L 27/14625; H01L 27/14678; H01L 31/02322; H01L 27/3276; H01L 51/52; H01L 51/5281; G06F 3/04164
    See application file for complete search history.

(56) References Cited

U.S. PATENT DOCUMENTS

| | | | | |
|---|---|---|---|---|
| 11,121,195 | B2* | 9/2021 | Park | G06V 40/1318 |
| 2017/0338292 | A1* | 11/2017 | Choi | H01L 27/3216 |
| 2018/0033835 | A1 | 2/2018 | Zeng et al. | |
| 2018/0299982 | A1 | 10/2018 | Liu et al. | |
| 2018/0308903 | A1* | 10/2018 | Jeong | H01L 27/3276 |
| 2019/0034688 | A1* | 1/2019 | Lee | H01L 51/5281 |
| 2019/0213379 | A1* | 7/2019 | Zhao | H01L 51/52 |
| 2020/0074139 | A1 | 3/2020 | Zhou et al. | |
| 2020/0089034 | A1* | 3/2020 | Liu | G06V 10/143 |
| 2020/0133414 | A1* | 4/2020 | Lee | G06F 3/04164 |

FOREIGN PATENT DOCUMENTS

| | | |
|---|---|---|
| CN | 107978624 A | 5/2018 |
| CN | 108288681 A | 7/2018 |
| CN | 108565279 A | 9/2018 |
| CN | 108846392 A | 11/2018 |
| CN | 110061040 A | 7/2019 |

OTHER PUBLICATIONS

Chinese First Office Action(Application No. 201910339585.2) and its brief translation dated Jan. 19, 2022.

* cited by examiner

DISPLAY PANELS, DISPLAY SCREENS, AND DISPLAY DEVICES

CROSS-REFERENCE TO RELATED APPLICATIONS

This application is a bypass continuation under 35 U.S.C. § 120 of international patent application PCT/CN2019/113689 filed on Oct. 28, 2019, which claims priority from Chinese Patent Application No. 201910339585.2, filed on Apr. 25, 2019 in the China National Intellectual Property Administration, the contents of both applications are hereby incorporated by reference.

TECHNICAL FIELD

The present application belongs to the field of display technology.

BACKGROUND

The fingerprint is unique to each individual and is consisted of ridges and valleys on the skin surface of the fingertip. These ridge and valley patterns determine the uniqueness of the fingerprint. The uniqueness and complexity of the patterns are enough to meet the identification requirements. With the rapid development of display technology, the display panel with a fingerprint identification function has been widely used in people's lives.

Moreover, with the rapid development of the display device, the user's demand for the screen-to-body ratio is higher and higher, causing more and more attention to the full-screen display of the display device in the industry.

SUMMARY

In view of this, it is necessary to provide a display panel, a display screen, and a display device.

According to an aspect of the present application, a display panel includes a display substrate; a light-emitting layer located on the display substrate and comprising a plurality of light-emitting units; an encapsulation structure disposed on the light-emitting layer to encapsulate the light-emitting layer; and a visible light conversion layer configured to receive visible lights and convert the visible lights into non-visible lights. The visible light conversion layer is disposed in the encapsulation structure or the display substrate.

According to another aspect of the present application, a display screen includes the above-described display panel and a fingerprint identification module located at a side, away from the displaying surface, of the display panel.

According to another aspect of the present application, a display device includes the above-described display screen.

In embodiments of the present application, the visible light conversion layer is disposed in the display panel, and the fingerprint identification module is disposed at the bottom side of the display panel. The visible lights emitted by the display panel are converted into non-visible lights via the visible light conversion layer. Since the OLED display screen has a good transmittivity for the non-visible lights, the fingerprint identification module can receive the non-visible lights to perform the fingerprint identification. As such, the fingerprint identification module can be configured to detect non-visible lights, thus substantially not being affected by visible lights. Therefore, the detection of the fingerprint identification module will not be affected by any image displayed by the display panel, thereby increasing the accuracy of the fingerprint identification. Moreover, the non-visible lights emitted by the visible light conversion layer will not affect the visible lights emitted by the display panel, thus not affecting the displaying effect either.

Therefore, the display screen is not limited by visible lights, thus solving the problem of the poor intensity of lights detected by the fingerprint identification component caused by the poor visible light transmittivity of PI of the flexible substrate. Moreover, since PI has a good non-visible light transmittivity, no hole or groove needs to be provided on the flexible substrate, thus simplifying the manufacturing process, decreasing the manufacturing cost, and avoiding hindering the mechanical property of the flexible substrate.

DETAILED DESCRIPTION

Conventionally, in order to maximize the screen-to-body ratio, the fingerprint identification component is disposed under the display screen to reduce the non-displaying area. However, at present, the organic light-emitting diode (OLED) display screen has a poor transmittivity for lights reflected by the user's fingerprint, thus affecting the accuracy of the fingerprint identification.

For a clear understanding of the technical features, objects, and effects of the present application, specific embodiments of the present application will now be described in detail with reference to the accompanying drawings. It is to be understood that the following description is merely exemplary embodiments of the present application, and is not intended to limit the scope of the present application.

For an OLED display screen, a fingerprint identification component is generally attached under the display screen. In operation, visible lights emitted by an OLED element in the OLED display screen are reflected by the user's fingerprint, transmitted through a display panel, and then detected by the fingerprint identification component attached under the display screen. However, nowadays, a material of a flexible substrate of a flexible display panel is generally a polymer such as a polyimide (PI) which has a poor visible light transmittivity, causing a poor intensity of lights detected by the fingerprint identification component. Therefore, the PI needs to be punched to form a hole, which significantly increases the manufacturing difficulty of the product and is unfavorable for the implementation of the fingerprint identification under the screen. The present application provides a display screen to solve the above-described problems.

Referring to FIGS. 1 to 6, embodiments of the present application provide a display panel and a display screen including the display panel. A visible light conversion layer 82 is disposed in the display panel 110. The visible light conversion layer 82 is configured to receive visible lights and convert the visible lights into non-visible lights receivable by a fingerprint identification module 120. The fingerprint identification module 120 is disposed at a bottom side of the display panel 110, i.e., a back surface opposite to a displaying surface of the display panel 110, i.e., a side, facing away from a light-emitting layer 50, of a display substrate 10 of the display panel 110. The visible lights emitted by the display panel 110 are converted into the non-visible lights via the visible light conversion layer 82. Since the OLED display screen has a good transmittivity for the non-visible lights, the fingerprint identification module 120 can receive the non-visible lights to perform the fingerprint identification. As such, the fingerprint identification module 120 can be configured to detect the non-visible lights, thus substantially not being affected by other visible lights. Therefore, the detection of the fingerprint identification module 120 will not be affected by any image displayed by the display panel of the display device, thereby increasing the accuracy of the fingerprint identification. Moreover, the non-visible lights emitted by the visible light conversion layer 82 will not affect the visible lights emitted by the display panel 100, thus not affecting the displaying effect either.

In some embodiments, the visible light conversion layer 82 is disposed in an encapsulation structure 70 or the display substrate 10.

In some specific embodiments, the non-visible lights are infrared lights. Correspondingly, the fingerprint identification module 120 can include an infrared sensor. The visible light conversion layer 82 can be an infrared quantum dot layer, such as a perovskite infrared quantum dot layer, a PbS infrared quantum dot layer, and a $Ag_2S$ infrared quantum dot layer. The infrared quantum dot layer can be made by ink-jet printing or other means.

The fingerprint identification module 120 according to embodiments of the present application is described in detail with an infrared sensor as an example herein. However, in other embodiments, the non-visible lights can be ultraviolet lights. In this case, the visible light conversion layer 82 may be different, and the fingerprint identification module 120 can adopt an ultraviolet sensor.

The display screen provided in the embodiments of the present application is not limited by visible lights, thus solving the problem of the poor intensity of lights detected by the fingerprint identification component caused by the poor visible light transmittivity of PI of the flexible substrate. Moreover, since PI has a good non-visible light transmittivity, no hole or groove needs to be provided on the flexible substrate, thus simplifying the manufacturing process, decreasing the manufacturing cost, and avoiding hindering the mechanical property of PI of the flexible substrate.

The display screen provided in the embodiments of the present application can be selected from various types of display screens, such as an OLED display screen, a liquid crystal display screen, and the like, which is not limited herein.

The term "displaying area" used herein refers to an active area (AA), having light-emitting elements disposed therein, defined in the display panel. The term "non-displaying area" used herein refers to a peripheral area for running signal lines of the display panel and is not allowed to be cut off. The display panel can include the displaying area having the light-emitting elements disposed therein and the non-displaying area having, for example, a drive circuit or a chip disposed therein.

Figure 1:
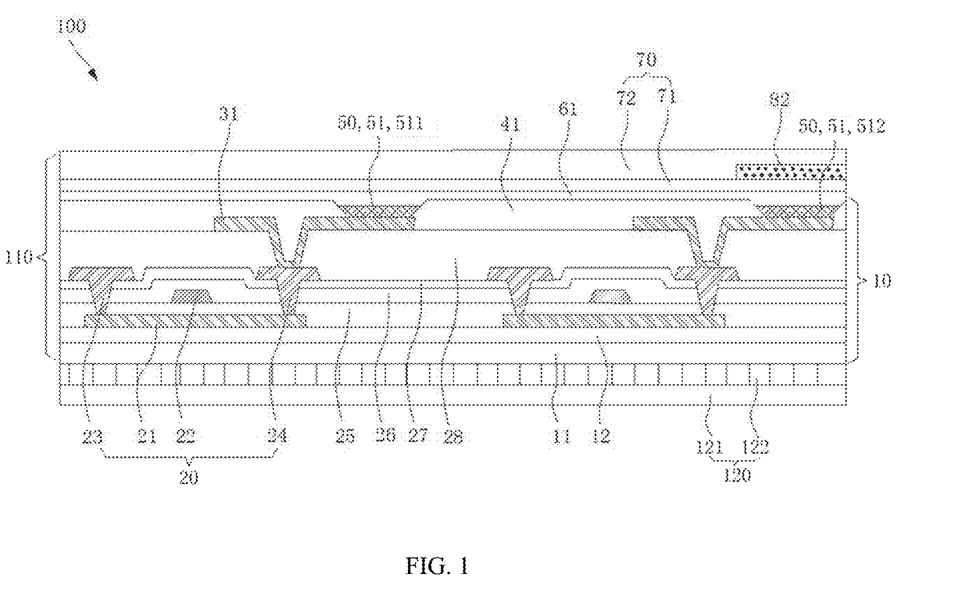
FIG. 1 is a schematic structural view of a display screen according to an embodiment of the present application, in which a visible light conversion layer is disposed in an encapsulation structure of a display panel of the display screen, corresponding to an area of a second light-emitting unit for providing lights to be reflected by the fingerprint.

Referring to FIG. 1, the present application provides a display screen 100 including a display panel 110 and a fingerprint identification module 120.

The display panel 110 includes a display substrate 10, a visible light conversion layer 82, a light-emitting layer 50 located on the display substrate 10, and an encapsulation structure 70 located on the light-emitting layer 50. The encapsulation structure 70 is configured to encapsulate the light-emitting layer 50. The visible light conversion layer 82 is configured to receive visible lights and convert the visible lights into non-visible lights receivable by the fingerprint identification module 120. The visible light conversion layer 82 is disposed in the encapsulation structure 70. In an embodiment, the visible light conversion layer 82 is configured to receive visible lights emitted by the light-emitting layer 50, and convert the visible lights into non-visible lights receivable by the fingerprint identification module 120. The non-visible lights are reflected by the fingerprint, and then received by the fingerprint identification module 120. In another embodiment, the visible light conversion layer 82 is configured to receive visible lights reflected by the fingerprint and convert the visible lights into non-visible lights receivable by the fingerprint identification module 120.

The fingerprint identification module 120 is disposed at a side, facing away from the light-emitting layer 50, of the display substrate 10. The fingerprint identification module 120 is configured to receive the non-visible lights to identify the fingerprint.

Figure 2:
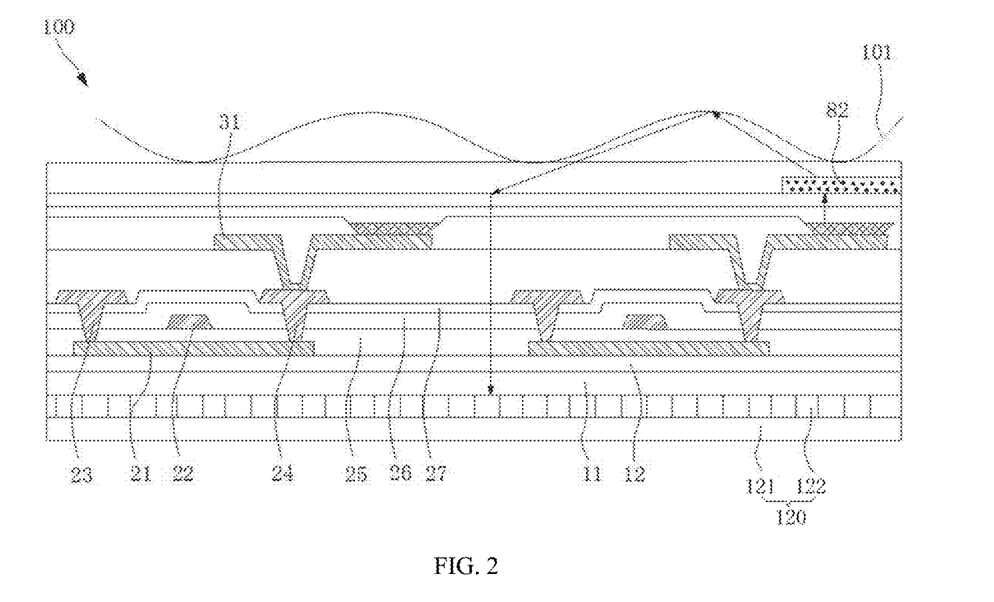
FIG. 2 is a schematic view showing the finger identification principle of the display screen as shown in FIG. 1.

In the fingerprint identification, referring to FIG. 2, the finger 101 is located above the light-emitting layer 50 and presses the upper side of the display panel 110 (the side proximal to the encapsulation structure 70). The visible lights emitted by the light-emitting layer 50 can be firstly transmitted to the visible light conversion layer 82 located in the encapsulation structure 70 and converted into the non-visible lights by the visible light conversion layer 82. Then, the non-visible lights are transmitted to the fingerprint pressed on the display panel 110, reflected by ridges and valleys of the fingerprint, and finally received by the fingerprint identification module 120 which performs the fingerprint identification.

In some embodiments, the display substrate 10 further includes a base substrate 11, a thin film transistor (TFT) 20 disposed on the base substrate 11, and a sub-pixel electrode 31 disposed on the thin film transistor 20. It should be understood that the display substrate 10 can further include films or layers, such as a planarization layer 28, a passivation layer (not shown), and a pixel-defining layer 41. In some embodiments, the display substrate 10 can be made by a low temperature poly-silicon (LTPS) technique.

The base substrate 11 can be formed of a suitable material, such as a glass material, a metal material, or a polymer material, such as polyethylene terephthalate (PET), polyethylene naphthalate (PEN), polyimide (PI), and so on. In some embodiments, the base substrate 11 is a flexible substrate made of a flexible material, such as polyimide (PI), polycarbonate (PC) resin (also called PC plastic), polyethylene terephthalate (PET) plastic, and so on.

In an embodiment, an additional layer such as a buffer layer 12 can be formed on the base substrate 11 before forming the TFT. The buffer layer 12 can be formed on an entire surface of the base substrate 11 or can be patterned.

The buffer layer 12 can have a layered structure in form of a single layer or multiple layers laminated with each other, and made of a suitable material selected from the group consisting of PET, PEN, polyacrylate, polyimide, and so on. The buffer layer 12 can also be formed of silicon oxide or silicon nitride. The buffer layer 12 can also include a composite layer made of an organic material and/or an inorganic material.

The thin film transistor 20 can include a semiconductor layer 21, a gate electrode 22, a source electrode 23, and a drain electrode 24. In some embodiments, through-holes can be formed in a gate insulating layer 25, an insulating dielectric layer 26, and an interlayer insulating layer 27. The source electrode 23 and the drain electrode 24 can be formed in the through-holes and electrically connected to the semiconductor layer 21, thereby forming a nesting hole structure. The source electrode 23 and the drain electrode 24 can be formed of a metal material to achieve a good reflecting effect for both the visible lights and the non-visible lights. The non-visible lights converted by the visible light conversion layer 82 and reflected by the fingerprint can travel through an area between the adjacent source electrode 23 and drain electrode 24 of the nesting hole structure, and reach the fingerprint identification module 120 located at the back surface of the display substrate 10, thereby preventing the lights emitted in all directions from the visible light conversion layer 82 from interacting with each other, interfering the fingerprint identification, and affecting the fingerprint imaging.

The semiconductor layer 21 can be formed of amorphous silicon material, metal oxide, or polycrystalline silicon, or can be formed of an organic semiconductor material. In an embedment, the semiconductor layer 21 includes a channel area, and doped source and drain areas.

The semiconductor layer 21 can be covered by the gate insulating layer 25. The gate electrode 22 can be disposed on the gate insulating layer 25. The gate insulating layer 25 can substantially cover the entire surface of the base substrate 11. In an embodiment, the gate insulating layer 25 can be patterned. Considering the attachment to the adjacent layer, the formability of the laminated target layer, and the surface flatness, the gate insulating layer 25 can be formed of silicon oxide, silicon nitride, or another organic or inorganic insulating material. The gate electrode 22 can be directly covered by the interlayer insulating layer 27. Alternatively, in some embodiments, the gate electrode 22 can be firstly covered by the capacitive insulating dielectric layer 26, and then by the interlayer insulating layer 27.

Since the thin film transistor (TFT) 20 has a complicated layered structure, it is necessary to form the planarization layer 28 onto the TFT 20, so as to form a sufficiently planar top surface. After forming the planarization layer 28, an electrode through-hole can be formed in the planarization layer 28 to expose the drain electrode 24.

Sub-pixel electrodes 31 can be formed on the planarization layer 28. The sub-pixel electrodes 31 can include a first sub-pixel electrode, a second sub-pixel electrode, and a third sub-pixel electrode. The first sub-pixel electrode is formed in a first sub-pixel area. The second sub-pixel electrode is formed in a second sub-pixel area. The third sub-pixel electrode is formed in a third sub-pixel area. That is to say, the sub-pixel electrodes 31 are corresponding to the sub-pixel areas on the display substrate 10 in a one-to-one manner. The first sub-pixel electrode, the second sub-pixel electrode, and the third sub-pixel electrode can be simultaneously or synchronously formed. Each of the first sub-pixel electrode, the second sub-pixel electrode, and the third sub-pixel electrode can be electrically connected to the drain electrode 24 of the thin film transistor 20 via the electrode through-hole. The first sub-pixel electrode, the second sub-pixel electrode, and the third sub-pixel electrode are commonly known as an anode.

When the first sub-pixel electrode, the second sub-pixel electrode, and the third sub-pixel electrode are transparent electrodes, they can be formed of indium tin oxide (ITO), indium zinc oxide (IZO), zinc oxide (ZnO), indium oxide ($In_2O_3$), indium gallium oxide (IGO), or aluminum zinc oxide (AZO).

When the first sub-pixel electrode, the second sub-pixel electrode, and the third sub-pixel electrode are reflecting electrodes, they can each include a reflecting layer and a conducting layer. The reflecting layer can be formed of at least one of silver (Ag), magnesium (Mg), aluminum (Al), platinum (Pt), palladium (Pd), gold (Au), nickel (Ni), neodymium (Nd), iridium (Ir), or chromium (Cr). The conducting layer can be formed of at least one of indium tin oxide (ITO), indium zinc oxide (IZO), zinc oxide (ZnO), or indium oxide ($In_2O_3$).

The structures and materials of the first sub-pixel electrode, the second sub-pixel electrode, and the third sub-pixel electrode are not limited thereto and can be varied according to actual needs.

After the formation of the first sub-pixel electrode, the second sub-pixel electrode, and the third sub-pixel electrode, a pixel-defining layer (PDL) 41 can be formed. The pixel-defining layer 41 is generally in form of a single material layer or a composite material layer made of a suitable organic material such as polyacrylate, polyimide, and so on.

The first sub-pixel electrode, the second sub-pixel electrode, and the third sub-pixel electrode are all covered by the pixel-defining layer 41. A plurality of openings arranged in an array can be formed in the pixel-defining layer 41 to exposed center portions of the first sub-pixel electrode, the second sub-pixel electrode, and the third sub-pixel electrode (the exposed area of the sub-pixel electrode is the effective area of the sub-pixel electrode).

A light-emitting material can be evaporated into the plurality of openings of the pixel-defining layer 41 to form a plurality of light-emitting units 51. That is, the plurality of light-emitting units 51 are isolated from each other via the pixel-defining layer 41. Correspondingly, the light-emitting units 51 are the sub-pixels including the first sub-pixel, the second sub-pixel, and the third sub-pixel. The first sub-pixel can be a sub-pixel emitting red light. The second sub-pixel can be a sub-pixel emitting green lights. The third sub-pixel can be a sub-pixel emitting blue lights. A layer where the light-emitting units 51 are located at is the light-emitting layer 50.

Then, a cathode electrode 61 covering the first sub-pixel, the second sub-pixel, and the third sub-pixel can be formed on the pixel-defining layer 41 by an evaporation method. The cathode electrode 61 can be a single body with respect to the plurality of light-emitting units 51, so as to cover the entire displaying area. The cathode electrode 61 is commonly known as a plane electrode.

The encapsulation structure 70 is formed on the cathode electrode 61 to encapsulate the light-emitting units 51. It is to be understood that the light-emitting unit 51 is an organic light-emitting layer, and thus is very sensitive to moisture, oxygen, and other external environmental factors. If the organic light-emitting layer in the display panel 110 is exposed to an environment containing moisture and/or oxygen, the performance of the display panel 110 would be significantly decreased or totally lost. The encapsulation structure 70 can block the air or moisture for the light-emitting unit 51, thereby ensuring the reliability of the display panel 110.

In an illustrative embodiment as shown in FIG. 1, the visible light conversion layer 82 is disposed in the encapsulation structure 70. In this case, the forming of the visible light conversion layer 82 can be performed after the preparation of the light-emitting units 51 to avoid the adverse effect of the high-temperature preparation process of the light-emitting units 51 on the visible light conversion layer 82.

In some embodiments, the plurality of light-emitting units 51 includes first light-emitting units 511 for displaying and second light-emitting units 512 for providing lights to be reflected by the fingerprint. That is to say, some of the plurality of light-emitting units 51 are the first light-emitting units 511, and some of the plurality of light-emitting units 51 are the second light-emitting units 512. These light-emitting units 51 can be spaced from each other. The visible light conversion layer 82 can be disposed corresponding to the area of the second light-emitting unit 512. The visible light conversion layer 82 is configured to receive visible lights emitted from the second light-emitting unit 512 and convert the visible lights into non-visible lights. The fingerprint identification module 120 is configured to receive the non-visible lights reflected by the fingerprint to identify the fingerprint.

The lights emitted from the light-emitting unit 51 generally have a color of red, green, blue, or white. One pixel unit includes at least one red light-emitting unit, at least one green light-emitting unit, and at least one blue light-emitting unit. In this embodiment, in addition to the first light-emitting units 511 for normally displaying to ensure the normal display of the display panel 110, the pixel unit further includes another light-emitting unit 51, i.e. the second light-emitting unit 512, to provide a light source for the visible light conversion layer 82. Therefore, more visible lights can be received by the visible light conversion layer 82 corresponding to the second light-emitting unit 512 and converted into the non-visible lights, to ensure that after the non-visible lights are reflected by the fingerprint, the intensity of the lights received by the fingerprint identification module 120 can be relatively high, thereby increasing the accuracy of the fingerprint identification.

The visible lights emitted from the second light-emitting unit 512 can be red lights, green lights, blue lights, or white lights, which are not limited herein.

It is to be understood that the visible light conversion layer 82 can be disposed as close to the second light-emitting unit 512 as possible to prevent the visible light conversion layer 82 from absorbing the visible lights emitted by the first light-emitting unit 511 and affecting the normal displaying of the first light-emitting unit 511. In an embodiment, an area of the visible light conversion layer 82 is substantially equal to an area of the corresponding second light-emitting unit 512. In an embodiment, an orthographic projection of the visible light conversion layer 82 on the display substrate 10 coincides with an orthographic projection of the corresponding second light-emitting unit 512 on the display substrate 10. As such, the lights generated by the second light-emitting unit 512 can be converted into non-visible lights such as infrared lights as much as possible, while the non-visible lights emitted from the visible light conversion layer 82 toward the second light-emitting unit 512 can be shielded by the second light-emitting unit 512, thereby preventing the interference of the non-visible lights emitted toward the second light-emitting unit 512 with the non-visible lights reflected by the fingerprint and preventing hindering the accuracy of the fingerprint identification.

It is to be understood that a part or entire of the displaying area of the display panel 110 can be provided with the above-described second light-emitting units 512, so that a part or entire of the displaying area of the display panel 110 is able to achieve the fingerprint identification. For example, when a part of the displaying area of the display panel 110 is provided with the above-described second light-emitting units 512, this part of the displaying area not only can normally display but also identify the fingerprint. For another example, when the entire displaying area of the display panel 110 is provided with the above-described second light-emitting units 512, the entire displaying area not only can normally display but also identify the fingerprint. When display panel 110 is a full-screen display panel, the display panel 110 can achieve the full-screen fingerprint identification.

In some embodiments, the visible light conversion layer 82 is disposed in the encapsulation structure 70. In this case, the visible light conversion layer 82 can be under protection while not affecting the encapsulation effect. Moreover, the visible light conversion layer 82 can be located relatively close to the fingerprint, so that the light absorption efficiency of the visible light conversion layer 82 can be increased, thereby increasing the intensity of the lights received by the fingerprint identification module 120 and the accuracy of the fingerprint identification. It is to be understood that the encapsulation structure 70 can be a single-layer structure or a multiple-layer structure. The encapsulation structure 70 can be an organic layer, an inorganic layer, or a laminated structure including the organic layer and the inorganic layer. In some embodiments, the encapsulation structure 70 can include two inorganic layers and one organic layer located between the two inorganic layers. In an embodiment, to dispose the visible light conversion layer 82 in the encapsulation structure 70, an inorganic encapsulation layer 71 can be firstly formed, the visible light conversion layer 82 can be then formed on the inorganic encapsulation layer 71, and another inorganic encapsulation layer 72 or an organic encapsulation layer can be finally formed. In addition, another inorganic encapsulation layer can be formed on the organic encapsulation layer. That is to say, the visible light conversion layer 82 is disposed in the encapsulation structure 70, the encapsulation structure 70 includes multiple encapsulation layers laminated with each other, and the visible light conversion layer 82 is located between two adjacent encapsulation layers.

The display panel 110 provided in embodiments of the present application can be a full screen or frameless display panel, and can also be a display panel having a regular frame or a narrow frame.

In some embodiments, the fingerprint identification module 120 includes a fingerprint sensor array layer 121. The fingerprint sensor array layer 121 includes a plurality of fingerprint sensors arranged in an array. Each fingerprint sensor in the fingerprint sensor array layer 121 includes a sensing electrode plate and an integrating circuit. When the finger contacts the display panel 110, the fingerprint of the finger and the fingerprint sensor constitute a fingerprint capacitance. A drive signal of the fingerprint sensor can be used to generate induced electric charges corresponding to the fingerprint capacitance. Since a distance between the ridge of the fingerprint and the sensing electrode plate is different from a distance between the valley of the fingerprint and the sensing electrode plate, the fingerprint capacitances respectively corresponding to the ridge and the valley are different, and the numbers of the corresponding induced electric charges are different. A process of causing a sensing electrode to generate induced electric charges in response to one drive signal is called a single coding process. The integrating circuit of the fingerprint sensor is configured to integrate the electric charges generated in several coding processes to calculate the capacitance value of the fingerprint capacitance. A processor of the fingerprint identification module 120 or the display device respectively converts the capacitance values obtained by the corresponding fingerprint sensors into digital signals and generate an image of the fingerprint according to the digital signals. The display device can verify whether the image of the fingerprint is consistent with the user's fingerprint template, thereby achieving fingerprint identification.

The fingerprint identification module 120 can further include a collimating layer 122. The collimating layer 122 is disposed between the fingerprint sensor array layer 121 and the display substrate 10, i.e., the collimating layer 122 is disposed between the fingerprint sensor array layer 121 and the display panel 110. The collimating layer 122 is configured to increase the efficacy and the intensity of the lights received by the fingerprint sensors and minimize the interference of the non-visible lights scattered from the visible light conversion layer 82 towards the display substrate 10 on the fingerprint detection. The collimating layer 122 can include a plurality of collimators.

The fingerprint identification module 120 can be disposed at a part or entire of the displaying area of the display panel 110. In some embodiments, the fingerprint identification module 120 is at least disposed at an area corresponding to the visible light conversion layer 82.

Figure 3:
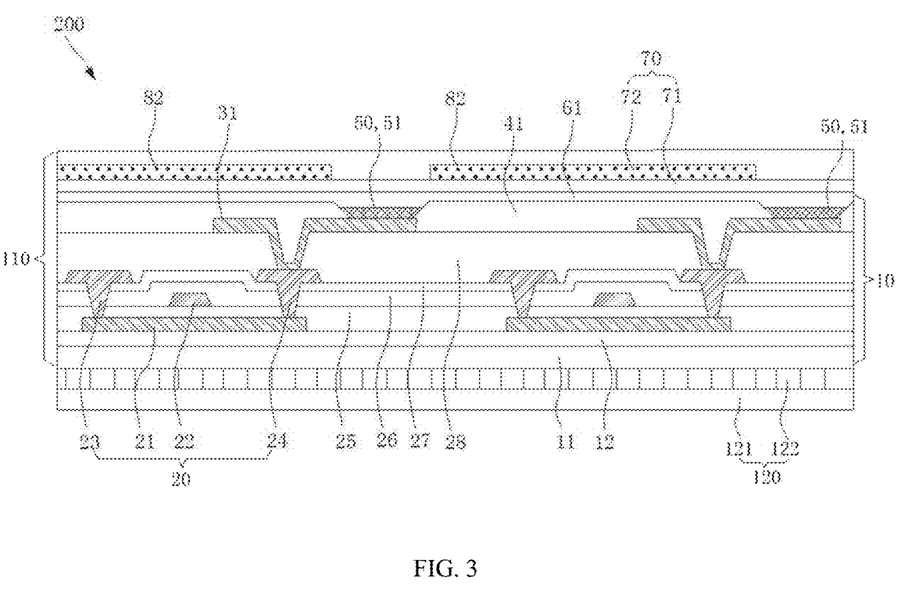
FIG. 3 is a schematic structural view of a display screen according to another embodiment of the present application, in which the visible light conversion layer is disposed in the encapsulation structure of the display panel of the display screen, corresponding to an area of a pixel-defining layer of a display substrate of the display panel of the display screen.

Referring to FIG. 3, in another display screen 200, the light-emitting units 51 includes no second light-emitting unit 512. The visible light conversion layer 82 is disposed in the encapsulation structure 70. The visible light conversion layer 82 is disposed corresponding to the area of the pixel-defining layer 41. In this case, the light-emitting unit 51 is not shielded by the visible light conversion layer 82, thus not affecting the normal displaying of the light-emitting layer 50. The visible light conversion layer 82 is configured to receive visible lights emitted from the light-emitting unit 51 and reflected by the fingerprint, and convert the visible lights into non-visible lights receivable by the fingerprint identification module 120.

Figure 4:
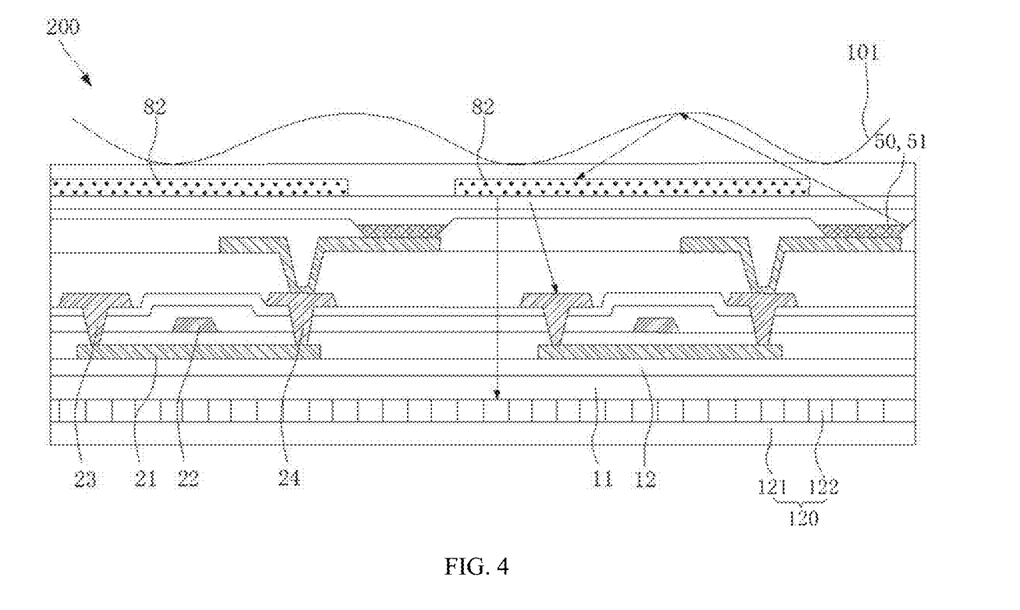
FIG. 4 is a schematic view showing the finger identification principle of the display screen as shown in FIG. 3.

In the fingerprint identification, as shown in FIG. 4, finger 101 presses the upper side of the display panel 110 (the side proximal to the encapsulation structure 70). The visible lights emitted by the light-emitting layer 50 are transmitted to the fingerprint pressed on the display panel 110, reflected by the ridges and valleys of the fingerprint, and then transmitted to the visible light conversion layer 82. The visible light conversion layer 82 receives the visible lights, converts the visible lights into non-visible lights, and then emits the non-visible lights towards the fingerprint identification module 120. The fingerprint identification module 120 receives the non-visible lights to identify the fingerprint.

Furthermore, an orthographic projection of the visible light conversion layer 82 on the display substrate 10 is within an orthographic projection of a top surface (a surface proximal to the encapsulation structure 70) of the pixel-defining layer 41 on the display substrate 10. The fingerprint identification can be achieved at a part or entire of the displaying area. In an embodiment, the orthographic projection of the visible light conversion layer 82 on the display substrate 10 coincides with the orthographic projection of the top surface (the surface proximal to the encapsulation structure 70) of the pixel-defining layer 41 on the display substrate 10.

Figure 5:
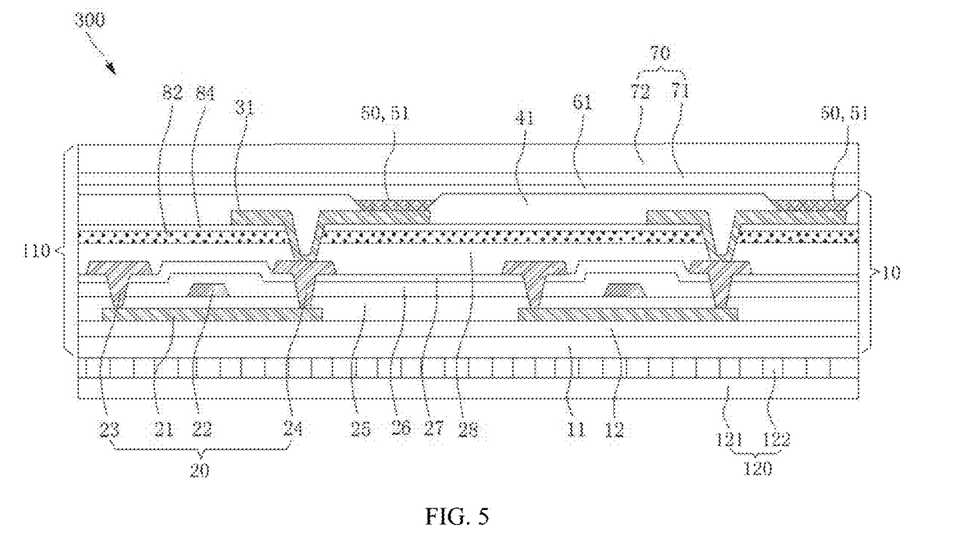
FIG. 5 is a schematic structural view of a display screen according to another embodiment of the present application, in which the visible light conversion layer is disposed in the display substrate of the display panel of the display screen, under the pixel-defining layer.

Referring to FIG. 5, in another display screen 300, the visible light conversion layer 82 is located in the display substrate 10. More specifically, the visible light conversion layer 82 is located under the pixel-defining layer 41, more specifically, between the base substrate 11 and the pixel-defining layer 41. The visible light conversion layer 82 is configured to receive the visible lights emitted by the light-emitting unit 51 and reflected by the fingerprint, and convert the visible lights into non-visible lights receivable by the fingerprint identification module 120. Since the visible light conversion layer 82 is located under the pixel-defining layer 41, the visible light conversion layer 82 cannot absorb the visible lights emitted by the light-emitting layer 50 but not reflected by the fingerprint, thus neither decreasing the opening ratio of the pixel-defining layer 41 nor hindering the displaying of the light-emitting layer 50. In addition, due to the shielding effect of the pixel-defining layer 41, the problem that the visible lights emitted by the light-emitting layer 50 can be directly transmitted to the visible light conversion layer 82 to affect the fingerprint imaging can be avoided. Therefore, the visible light conversion layer 82 can cover the entire displaying area of the display panel 110, and the fingerprint sensor array layer 121 can be disposed corresponding to the entire displaying area of the display panel 110, so as to achieve the full-screen fingerprint identification. That is to say, the orthographic projection of the visible light conversion layer 82 on the base substrate 11 can cover the entire orthographic projection of the light-emitting layer 50 on the base substrate 11.

Figure 6:
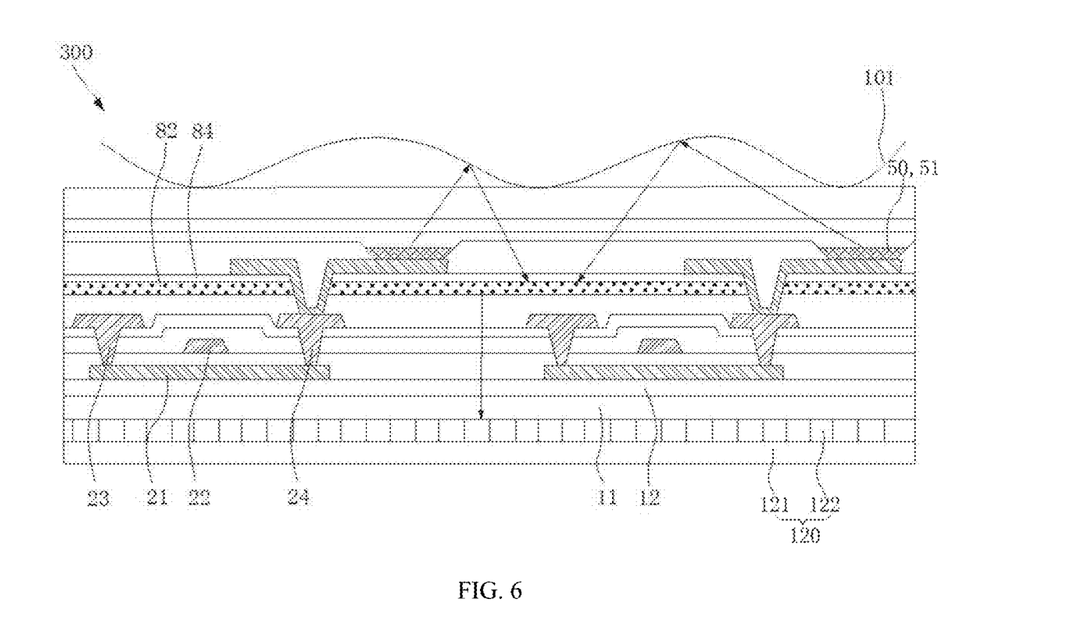
FIG. 6 is a schematic view showing the finger identification principle of the display screen as shown in FIG. 5.

In this case, referring to FIG. 6, in the fingerprint identification, finger 101 presses the upper side of the display panel 110 (the side proximal to the encapsulation structure 70). The visible light emitted by the light-emitting layer 50 is transmitted to the fingerprint pressed on the display panel 110, reflected by ridges and valleys of the fingerprint, and then transmitted to the visible light conversion layer 82. The visible light conversion layer 82 receives the visible lights reflected by the fingerprint, converts the visible lights into the non-visible lights, and transmits the non-visible lights toward the fingerprint identification module 120. The fingerprint identification module 120 receives the non-visible lights to identify the fingerprint.

In some embodiments, when the display panel 110 further includes the planarization layer 28 located under the pixel-defining layer 41, the visible light conversion layer 82 is located between the pixel-defining layer 41 and the planarization layer 28. It is conducive to form the planar visible light conversion layer 82 on the planarization layer 28.

In some embodiments, the display panel 110 further includes a protection layer 84 covering the visible light conversion layer 82. The protection layer 84 is located between the visible light conversion layer 82 and the pixel-defining layer 41 to protect the visible light conversion layer 82. The protection layer 84 can be formed of silicon nitride. The protection layer 84 can be made by a low-temperature process to minimize the damage of the visible light conversion layer 82.

The present application further provides a display device including the above-described display screen.

The display device can be any product or component with the fingerprint identification function, such as a mobile phone, a tablet computer, a television, a display, a laptop, a digital photo frame, a vehicle-mounted device, a wearable device, or an internet-connected device.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present application.

What is described above are only several implementations of the present application, and these embodiments are specific and detailed, but not intended to limit the scope of the present application. It should be understood by the skilled in the art that various modifications and improvements can be made without departing from the conception of the present application, and all fall within the protection scope of the present application. Therefore, the patent protection scope of the present application is defined by the appended claims.

What is claimed is:

1. A display panel comprising
   a display substrate comprising a pixel-defining layer;
   a light-emitting layer located on the display substrate and comprising a plurality of light-emitting units, the plurality of light-emitting units comprising a first light-emitting unit and a second light-emitting unit;
   an encapsulation structure disposed on the light-emitting layer to encapsulate the light-emitting layer;
   a visible light conversion layer configured to receive a visible light emitted by the second light-emitting unit and convert the visible light into a non-visible light; and
   a protection layer covering the visible light conversion layer and located between the visible light conversion layer and the pixel-defining layer;
   wherein the visible light conversion layer is disposed corresponding to the second light-emitting unit, and an area of the visible light conversion layer is substantially equal to an area of the second light-emitting unit.

2. The display panel of claim 1, wherein the visible light conversion layer is an infrared quantum dot layer.

3. The display panel of claim 1, wherein the visible light conversion layer is configured to receive the visible light emitted by the second light-emitting unit, convert the visible light into the non-visible light, and allow the non-visible light to be transmitted towards a displaying surface of the display panel.

4. The display panel of claim 1, wherein the visible light conversion layer is configured to receive the visible light emitted by the second light-emitting unit and then reflected by a fingerprint, convert the visible light into the non-visible light, and allow the non-visible light to be transmitted towards a side away from a displaying surface of the display panel.

5. The display panel of claim 3, wherein the first light-emitting unit is configured for displaying and the second light-emitting unit is configured for providing the visible light to the visible light conversion layer, and the visible light conversion layer is configured to receive the visible light emitted by the second light-emitting unit and convert the visible light into the non-visible light which is to be reflected by a fingerprint and receivable by a fingerprint identification module.

6. The display panel of claim 5, wherein an orthographic projection of the visible light conversion layer on the display substrate coincides with an orthographic projection of the second light-emitting unit on the display substrate.

7. The display panel of claim 5, wherein each pixel unit in a fingerprint identification area of the display panel comprises one second light-emitting unit.

8. The display panel of claim 1, wherein the display substrate comprises a pixel-defining layer configured to isolate the plurality of light-emitting units from each other, the visible light conversion layer is disposed corresponding to an area of the pixel-defining layer, and the visible light conversion layer is configured to receive the visible light emitted by the second light-emitting unit and then reflected by a fingerprint and convert the visible light into the non-visible light receivable by a fingerprint identification module.

9. The display panel of claim 8, wherein an orthographic projection of the visible light conversion layer on the display substrate is within an orthographic projection of a top surface of the pixel-defining layer on the display substrate.

10. The display panel of claim 1, wherein the encapsulation structure comprises multiple encapsulation layers laminated with each other, and the visible light conversion layer is located between two adjacent encapsulation layers.

11. A display screen, comprising the
    display panel of claim 1
    and
    a fingerprint identification module,
    wherein the fingerprint identification module is located at a side of the display panel, away from a displaying surface of the display panel.

12. The display screen of claim 11, wherein the fingerprint identification module comprises a fingerprint sensor array layer comprising a plurality of fingerprint sensors arranged in an array, when a finger contacts the display panel, a fingerprint of the finger and each of the fingerprint sensors constitute a fingerprint capacitance.

13. The display screen of claim 12, wherein the fingerprint identification module further comprises a collimating layer disposed between the fingerprint sensor array layer and the display substrate, and the collimating layer comprises a plurality of collimators.

14. The display screen of claim 11, wherein the fingerprint identification module is at least disposed at an area corresponding to the visible light conversion layer.

15. The display panel of claim 1, wherein the visible light conversion layer is disposed in the encapsulation structure.

16. A display panel, comprising:
    a display substrate;
    a light-emitting layer located on the display substrate and comprising a plurality of light-emitting units;
    an encapsulation structure disposed on the light-emitting layer to encapsulate the light-emitting layer;
    a visible light conversion layer configured to receive a visible light and convert the visible light into a non-visible light; and
    a protection layer covering the visible light conversion layer and located between the visible light conversion layer and the pixel-defining layer;
    wherein the display substrate comprises a base substrate, a planarization layer disposed on the base substrate, and a pixel-defining layer disposed on the planarization layer and configured to isolate the plurality of light-emitting units from each other; the visible light conversion layer is located between the pixel-defining layer and the planarization layer, and the visible light conversion layer is configured to receive a visible light emitted by the light-emitting layer and then reflected by a fingerprint, and convert the visible light into a non-visible light receivable by a fingerprint identification module.

17. The display panel of claim 16, wherein the protection layer is a silicon nitride layer.

18. The display panel of claim 16, wherein the visible light conversion layer covers an entire displaying area of the display panel.

19. The display panel of claim 16, wherein an orthographic projection of the visible light conversion layer on the base substrate covers an orthographic projection of the light-emitting layer on the base substrate.

* * * * *